United States Patent
Ardisana, II et al.

(10) Patent No.: US 10,120,414 B2
(45) Date of Patent: Nov. 6, 2018

(54) DOCKING STATION WITH INTEGRAL DEVICE SUPPORT STRUCTURE

(71) Applicant: APPLE INC., Cupertino, CA (US)

(72) Inventors: John B. Ardisana, II, San Francisco, CA (US); Dhaval N. Shah, Fremont, CA (US); Teodor Dabov, San Francisco, CA (US); Darshan R. Kasar, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 166 days.

(21) Appl. No.: 15/221,452

(22) Filed: Jul. 27, 2016

(65) Prior Publication Data

US 2016/0363958 A1   Dec. 15, 2016

Related U.S. Application Data (63) Continuation of application No. 14/659,176, filed on Mar. 16, 2015, now Pat. No. 9,466,927.

(60) Provisional application No. 62/047,563, filed on Sep. 8, 2014.

(51) Int. Cl.

| G06F 1/16 | (2006.01) |
|---|---|
| H05K 5/02 | (2006.01) |
| H01R 13/631 | (2006.01) |
| H01R 13/74 | (2006.01) |
| H04M 1/04 | (2006.01) |
| F16M 11/10 | (2006.01) |
| F16F 1/36 | (2006.01) |
| F16F 7/12 | (2006.01) |
| H04M 1/02 | (2006.01) |

(52) U.S. Cl.
CPC ....... *G06F 1/1632* (2013.01); *H01R 13/6315* (2013.01); *H01R 13/74* (2013.01); *H04M 1/04* (2013.01); *H05K 5/0204* (2013.01); *F16F 1/36* (2013.01); *F16F 7/123* (2013.01); *F16M 11/10* (2013.01); *H04M 1/0274* (2013.01)

(58) Field of Classification Search
CPC .... H04M 1/04; H04M 1/0274; H05K 5/0204; F16F 1/36; F16F 7/123; F16M 11/10; G06F 1/1632; H01R 13/6315; H01R 13/74
USPC ........................................................ 439/248
See application file for complete search history.

(56) References Cited

U.S. PATENT DOCUMENTS

| 3,605,069 A | 9/1971 | Dorrell |
|---|---|---|
| 5,875,094 A | 2/1999 | Kirkendoll |
| 5,959,835 A | 9/1999 | Dohi et al. |
| 6,115,247 A | 9/2000 | Helot |

(Continued)

FOREIGN PATENT DOCUMENTS

| EP | 2706429 A2 | 3/2014 |
|---|---|---|
| JP | 3212076 | 8/2017 |

(Continued)

OTHER PUBLICATIONS

Advisory Action for U.S. Appl. No. 12/156,821, dated Feb. 12, 2014, 3 pages.

(Continued)

*Primary Examiner* — Anita M King
(74) *Attorney, Agent, or Firm* — Kilpatrick Townsend and Stockton, LLP (57) ABSTRACT

An aesthetically pleasing docking station that is able to support electronic devices with only an interface connector. The docking station is further equipped with mechanisms that protect the electronic device from damage if it's deflected too far while mated to the docking station.

20 Claims, 5 Drawing Sheets

(56) References Cited

U.S. PATENT DOCUMENTS

| | | |
|---|---|---|
| 6,216,195 B1 | 4/2001 | Lee et al. |
| 6,301,106 B1 | 10/2001 | Helot et al. |
| 6,560,097 B2 | 5/2003 | Naruo et al. |
| 6,752,632 B1 | 6/2004 | Anderson et al. |
| 7,014,486 B1 | 3/2006 | Wu et al. |
| 7,066,752 B2 | 6/2006 | Hsu et al. |
| 7,119,830 B2 | 10/2006 | Saito et al. |
| 7,142,421 B2 | 11/2006 | Cheng et al. |
| 7,386,868 B2 | 6/2008 | McCormack |
| 7,643,283 B2 | 1/2010 | Jubelirer et al. |
| 7,675,746 B2 | 3/2010 | Crooijmans et al. |
| 7,683,573 B2 | 3/2010 | Nikazm et al. |
| 7,719,830 B2 | 5/2010 | Howarth et al. |
| 7,840,740 B2 | 11/2010 | Minoo et al. |
| 7,857,541 B2 | 12/2010 | Gong |
| 7,869,195 B1 | 1/2011 | Patton |
| 8,007,309 B2 | 8/2011 | Fan |
| 8,535,102 B1 | 9/2013 | Colahan et al. |
| 8,721,356 B2 | 5/2014 | Webb et al. |
| 8,792,233 B2 | 7/2014 | Terlizzi |
| 8,986,029 B2 | 3/2015 | Webb et al. |
| 9,054,478 B2 | 6/2015 | Golko et al. |
| 9,103,484 B2 | 8/2015 | Hayashi et al. |
| 9,178,299 B2 | 11/2015 | Alexia et al. |
| 9,201,453 B2 | 12/2015 | Stanley |
| 9,535,456 B2 | 1/2017 | Terlizzi |
| 9,778,690 B2 | 10/2017 | Ardisana et al. |
| 2001/0026437 A1 | 10/2001 | Naruo et al. |
| 2004/0145864 A1 | 7/2004 | Usui et al. |
| 2004/0229494 A1 | 11/2004 | Hsu et al. |
| 2007/0069088 A1 | 3/2007 | Bidiville et al. |
| 2007/0127205 A1 | 6/2007 | Kuo |
| 2008/0239658 A1 | 10/2008 | Chou et al. |
| 2009/0009957 A1 | 1/2009 | Crooijmans et al. |
| 2011/0095724 A1 | 4/2011 | Byrne |
| 2011/0164375 A1 | 7/2011 | Hayashida et al. |
| 2012/0264329 A1 | 10/2012 | Hayashida et al. |
| 2013/0163186 A1 | 6/2013 | Mizusawa |
| 2014/0069710 A1 | 3/2014 | Webb et al. |
| 2014/0242848 A1 | 8/2014 | Golko et al. |
| 2014/0293530 A1 | 10/2014 | Terlizzi |
| 2016/0069507 A1 | 3/2016 | Ardisana, II |
| 2016/0091925 A1 | 3/2016 | Ardisana, II et al. |

FOREIGN PATENT DOCUMENTS

| | | |
|---|---|---|
| KR | 1020010027186 A | 4/2001 |
| KR | 1020130012254 A | 2/2013 |

OTHER PUBLICATIONS

Final Office Action for U.S. Appl. No. 12/156,821, dated Oct. 26, 2011, 14 pages.
Non-Final Office Action for U.S. Appl. No. 12/156,821, dated Mar. 4, 2011, 15 pages.
Final Office Action for U.S. Appl. No. 14/502,594, dated Nov. 21, 2016, 12 pages.
Notice of Allowance for U.S. Appl. No. 14/659,176, dated Aug. 17, 2016, 5 pages.
International Application No. PCT/US2015/040641, "International Search Report and Written Opinion", dated Oct. 12, 2015, 14 pages.
U.S. Appl. No. 14/659,176, "Non-Final Office Action", dated Apr. 8, 2016, 8 pages.
International Preliminary Report issued in PCT Application No. PCT/US2015/040641, dated Mar. 23, 2017 in 11 pages.
Advisory Action in U.S. Appl. No. 14/502,594, dated Apr. 6, 2017 in 5 pages.
Notice of Allowance in U.S. Appl. No. 14/502,594, dated Jul. 24, 2017 in 10 pages.
Office Action in China Application No. CN201590000921.6, dated Aug. 29, 2017, 1 page.
Office Action in China Application No. CN201590000921.6, dated Aug. 4, 2017 in 1 page.
International Preliminary Report on Patentability for PCT Application No. PCT/US2015/040641, dated Mar. 23, 2017, in 11 pages.
Notice of Decision to Grant in China Application No. CN201590000921.6, dated Jan. 16, 2018 in 2 pages.
Office Action in Korea Application No. KR20-2017-7000022, dated Feb. 23, 2018 in 13 pages.

DOCKING STATION WITH INTEGRAL DEVICE SUPPORT STRUCTURE

CROSS-REFERENCE TO RELATED APPLICATIONS

This Continuation application claims the benefit of U.S. Non-Provisional application Ser. No. 14/659,176, filed Mar. 16, 2015, entitled, "DOCKING STATION WITH INTEGRAL DEVICE SUPPORT STRUCTURE", which claims priority to Provisional Application No. 62/047,563, filed Sep. 8, 2014, entitled "DOCKING STATION WITH INTEGRAL DEVICE SUPPORT STRUCTURE", which are hereby incorporated by references in their entirety for all purposes.

FIELD

The present invention relates generally to docking stations for portable electronic devices and in particular to docking stations that are aesthetically pleasing and can protect electronic devices from damage if they are deflected too far while mated.

BACKGROUND

Currently there are a wide variety of electronic device docking stations that include a connector for electrically connecting to the electronic device. The connection between the dock and the electronic device may be established to provide power, to transfer data or other information, or for any other suitable reason. Consumers may desire an aesthetically pleasing docking station with only the connector disrupting the exterior surface of the docking station. Consumers may also desire that the dock hold the electronic device at a convenient viewing angle while allowing the consumer to temporarily tilt the device to a more vertical position providing an intuitive demoting motion. Finally, consumers may also desire to protect the electronic device from damage if it's deflected too far while mated.

New docking stations may require new features to support electronic devices at an appropriate viewing angle with only the connector while also protecting the electronic devices from damage while mated.

SUMMARY

Embodiments of the invention pertain to docking stations for electronic devices. In some embodiments the docking station may be configured to provide an aesthetically pleasing appearance while protecting the electronic device from damage while mated.

Some embodiments of the present invention relate to a docking station having a housing including a cover disposed above and secured to a base. A connector plug may provide plenary support for an electronic device and have a first end secured to the housing base and a second end extending at an acute angle beyond an exterior surface of the cover. A brace may be disposed within the housing and configured to support the connector plug. The brace may further be configured to define the acute angle. A flexible structure may be coupled to the connector plug and to the housing enabling the connector plug to be forcibly deflected in a direction away from the brace.

Further embodiments may have a brace that is configured to support a predetermined maximum amount of force applied to the connector plug and to deflect if the maximum amount of force is exceeded. In some embodiments, the predetermined maximum amount of force may be less than a minimum force that is required to damage the portable electronic device.

Some embodiments may relate to a docking station having a housing base with a bottom wall configured to flex. A connector may be mounted to the bottom wall at an acute angle and configured to mate with a portable electronic device. A housing cover may be secured to the housing base and may have an aperture with an elastomeric insert through which the connector protrudes. The bottom wall and the elastomeric insert may deflect when the connector is moved. A support brace may be disposed within the housing, supporting the connector at the acute angle.

Further embodiments may be configured such that the bottom wall of the housing base includes an insert molded mounting plate that interfaces with the connector. Some embodiments may have a mass plate is disposed within the enclosure secured to the housing base. Further, the support brace may be secured to the mass plate.

Some embodiments may have a support brace configured to provide support to the connector up to a predetermined maximum amount of force applied to the connector. The support brace may further be configured to deflect if the predetermined maximum amount of force applied to the connector is exceeded.

To better understand the nature and advantages of the present invention, reference should be made to the following description and the accompanying figures. It is to be understood, however, that each of the figures is provided for the purpose of illustration only and is not intended as a definition of the limits of the scope of the present invention. Also, as a general rule, and unless it is evident to the contrary from the description, where elements in different figures use identical reference numbers, the elements are generally either identical or at least similar in function or purpose.

DETAILED DESCRIPTION

Certain embodiments of the present invention relate to docking stations for electronic devices. While the present invention can be useful for a wide variety of docking stations, some embodiments of the invention are particularly useful for docking stations that use only the interface connector for support, as described in more detail below.

Figure 1:
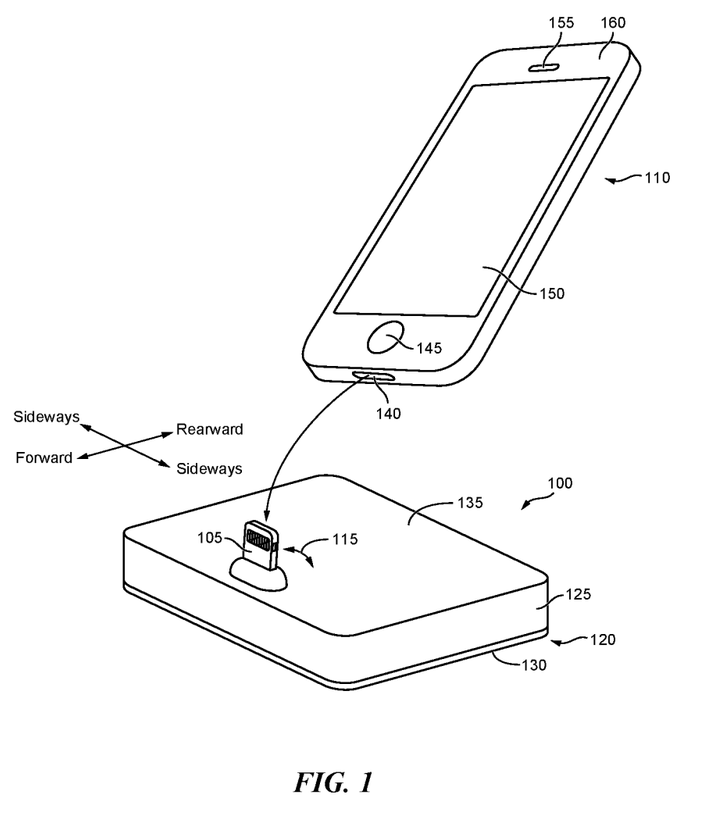
FIG. 1 is a front perspective view of an electronic device and a docking station according to an embodiment of the invention.

FIG. 1 depicts an illustrative rendering of one embodiment of a docking station 100 with an interface connector plug 105 that may provide plenary support for an electronic device 110 without the need for external support structures, providing an aesthetically appealing appearance. Docking station 100 may also hold electronic device 110 at an acute angle 115, allow electronic device 110 to be tilted forward for easy removal by the user and may further protect the device from harm if it's deflected too far while mated with the docking station. Myriad protective features may be employed by themselves or in conjunction with one another such that if electronic device 110 is deflected too far forward, rearward or sideways, docking station 100 fails before the electronic device, as discussed in more detail below.

Docking station 100 has a housing 120 comprising a cover 125 disposed above and secured to a housing base 130. Housing 120 may have an exterior surface 135 and plug connector 105 protruding from a facet of exterior surface at acute angle 115. Plug connector 105 may be configured to mate with a receptacle connector 140 of electronic device 110. When mated, the only support holding electronic device 110 to docking station 100 may be provided by plug connector 105, resulting an aesthetically pleasing design.

Electronic device 110 includes a multipurpose button 145 as an input component, a touch screen display 150 as both an input and output component, and a speaker 155 as an output component, all of which are enclosed within device housing 160. Receptacle connector 140 can be positioned within device housing 160 and configured to mate with corresponding plug connector 105 of docking station 100.

In order to better appreciate the features and aspects of docking stations according to the present invention, further context for the invention is provided in the following section by discussing one particular implementation of a docking station according to an embodiment of the present invention.

Figure 2:
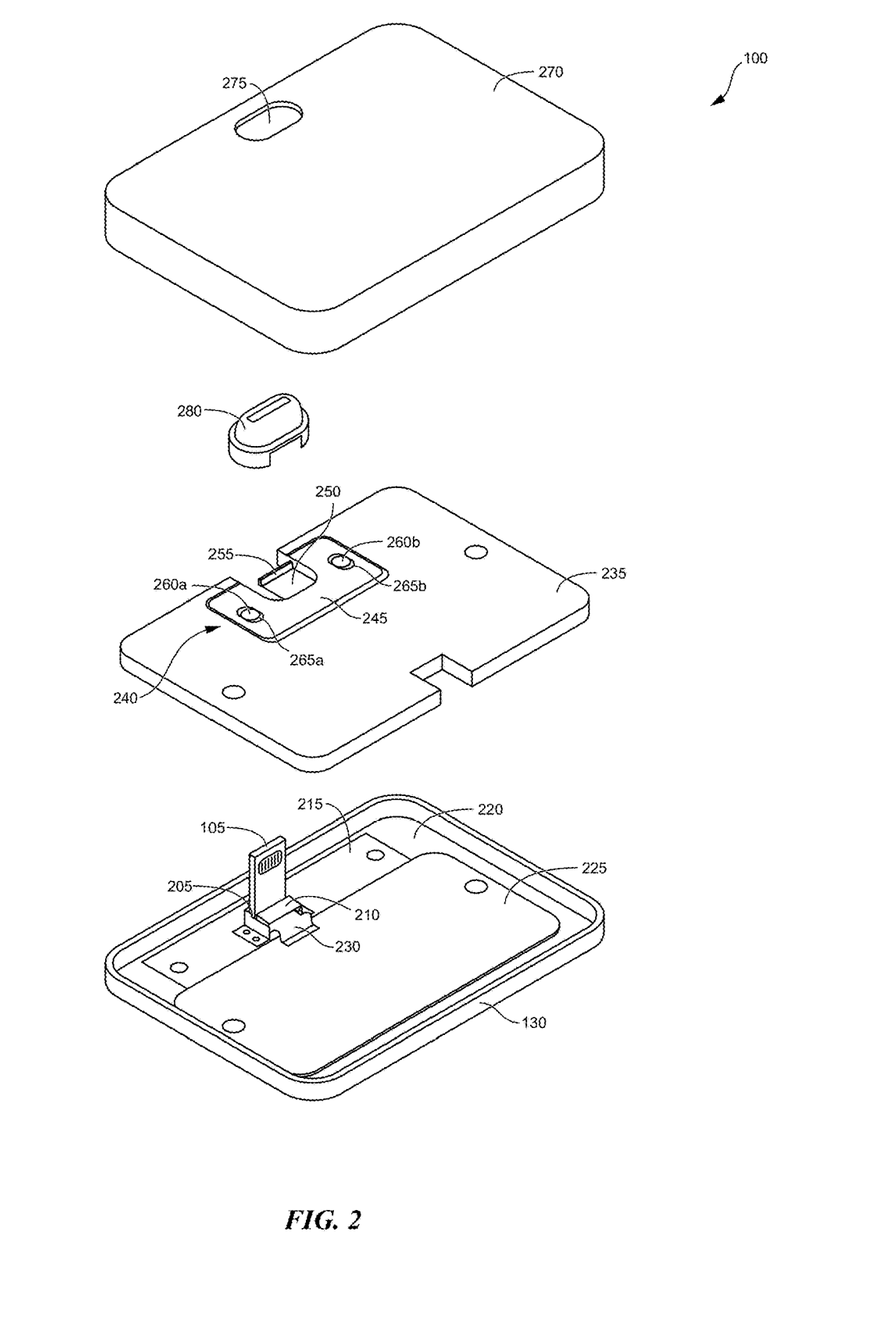
FIG. 2 is an exploded view of the components of the docking station shown in FIG. 1 according to an embodiment of the invention.

Now referring to FIG. 2, a simplified exploded isometric view of an embodiment of docking station 100 is provided. This illustration shows the primary internal and external components that make up docking station 100 and how they fit together. Connector 105 has first end 205 secured to housing base 130. More specifically, connector 105 is secured by bracket 210 to mounting panel 215 disposed within housing base 130. Bracket 210 will be discussed in more detail below. In some embodiments, mounting panel 215 may be insert molded in a bottom wall 220 housing base 130. Bracket 210 may be secured to mounting panel 215 with any type of fastener, weld, or other means. A circuit board 225 is disposed on housing base 130 and provides communication between connector 105 and another electronic device and/or facilitates connection to a power source. Connector 105 may be electrically connected to printed circuit board 225 with a flexible circuit 230 or other method such as, but not limited to, wires.

A mass plate 35 may be disposed over a portion of printed circuit board 225 and may also be secured to housing base 130. Mass plate 235 may be made from a metal or metal alloy and primarily serve as mass for docking station 100 so that it is stable and holds electronic device 110 (see FIG. 1) securely.

A support brace 240 may be secured to mass plate 235 and may be configured to provide support to connector 105, as discussed in more detail below. Support brace 240 may comprise adjustable plate 245 having a deformable beam 250 coupled to afoot 255 that supports connector 105. Support brace 240 may be configured to provide a predetermined amount of support to connector 105 and may further be configured to deform above a particular force to protect electronic device 110 (see FIG. 1) from damage due to over deflection, as discussed in more detail below. In one embodiment, adjustable plate 240 may be attached to mass plate 235 with two fasteners 260a, 260b such that when the fasteners are loosened the adjustable plate may be slid in a substantially rectilinear pattern forward and backward along a path defined by slots 265a, 265b. During assembly, when fasteners 260a, 260b are loose, adjustable plate 245 may be slid against connector 105 and used to define an acute angle 115 (see FIG. 1) of connector 105, as discussed in more detail below. In some embodiments support brace 240 may be manufactured from a metal or metal alloy. In other embodiments support brace 240 may be manufactured from a plastic or other material. In further embodiments, support brace 240 may be integrated with mass plate 235 and comprise a substantially unitary structure. In such embodiments mass plate 235 may be adjustable such that foot 255 can be slid into contact with connector 105 to define acute angle 115 (see FIG. 1) of the connector.

Housing cover 270 may be disposed on top of and secured to housing base 130. Housing cover 270 and housing base 130 may form an enclosure having an internal cavity. Housing cover 270 may have an aperture 275 with an elastomeric insert 280 through which connector 105 protrudes. Elastomeric insert 280 may be secured to aperture 275. In some embodiments, housing cover 270 and housing base 130 may be made from a plastic material, while in other embodiments different materials may be used such as, but not limited to, metal.

Figure 3:
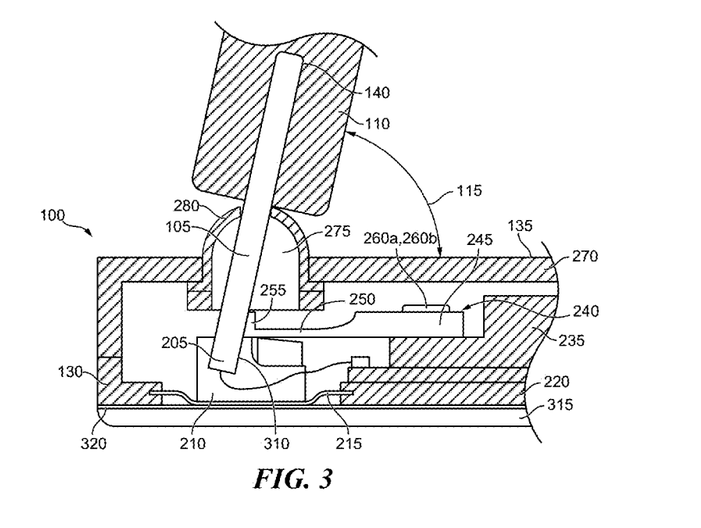
FIG. 3 is a partial cross-sectional view of the docking station shown in FIG. 1 with an electronic device mated to it.

Now referring to FIG. 3, a simplified partial cross-sectional view of electronic device 110 fully mated to docking station 100 (i.e., receptacle connector 140 of electronic device 110 is fully mated with plug connector 105 of docking station 100) is illustrated. This figure illustrates how the internal and external components of docking station 100 are aligned and how they provide support and protection for electronic device 110.

In some embodiments, connector 105 provides the only mechanical support for electronic device 110, making exterior surface 135 of docking station 100 aesthetically pleasing (i.e., there are no other support structures on the exterior surface of the docking station to support the electronic device). In some embodiments, first end 205 of plug connector 105 may be secured by bracket 210 to mounting plate 215. Mounting plate 215 may be disposed within bottom wall 220 of housing base 130. In some embodiments, mounting plate 215 may be made from a metal or metal alloy and insert-molded into bottom wall 220. In other embodiments there may not be a mounting plate 215 and bracket 210 may be secured to a substantially contiguous bottom wall 220.

Connector 105 may be positioned to protrude through elastomeric insert 280 disposed within aperture 275 of cover 270. To provide the necessary mechanical structure for connector 105 to support the weight of electronic device 110 at acute angle 115, support brace 240 may be adjusted so that foot 255 is positioned against rear surface 310 of connector 105. As discussed above, support brace 240 may be a rigid brace configured to provide support to connector 105. Support brace 240 may comprise adjustable plate 245 attached to mass plate 235 and a deformable beam 250 coupled to a foot 255 that provides support to connector 105.

Support brace 240 may be configured to provide a predetermined amount of support to connector 105 and may further be configured to deform above a particular force, as discussed in more detail below. Adjustable plate 245 may be attached to mass plate 235 with two fasteners 260a, 260b such that when the fasteners are loosened support brace 240 may be slid into contact with connector 105. Other means of fastening adjustable plate 245 to mass plate are within the scope of this disclosure such as a single fastener with rails to maintain alignment of support brace 240, glue, welding in place as well as other methods. During assembly, when fasteners 260a, 260b are loose, support brace 240 may be slid against connector 105 and used to define acute angle 115 of connector 105.

Connector 105 may extend at acute angle 115 beyond exterior surface 135 of housing cover 270 to facilitate connection with electronic device 110. Positioning electronic device 110 at acute angle 115 may provide the user with an improved viewing angle for electronic device 110 and make it easier for a user to interact with the device. In some embodiments, support brace 240 may be used to adjust acute angle 115 such that manufacturing variations that may affect the acute angle can be adjusted out. In some embodiments acute angle 115 is between 69 and 89 degrees and in some embodiments the angle is between 74 and 84 degrees. In one embodiment acute angle 115 is approximately 79 degrees.

In some embodiments elastomeric insert 280 may fit relatively tightly around connector 105 so that little or no gaps exist between the connector and docking station 100, providing an aesthetically appealing appearance. In further embodiments elastomeric insert 280 may allow connector 105 to deflect as discussed herein without allowing gaps to appear between connector 105 and docking station 100, maintaining the aesthetically pleasing appearance.

In further embodiments, bottom wall 220 of housing base 130 may be equipped with an elastomeric mounting pad 315. Elastomeric pad 315 may enable docking station 100 to be securely affixed to surfaces, facilitating the user's interaction with electronic device 110. In further embodiments bottom wall 220 of housing base 130 may have a metal foil 320 disposed between bottom wall 220 and elastomeric pad 315 to smooth discontinuities in the bottom wall of the housing base so they aren't visible in the elastomeric mounting pad.

Figure 4:
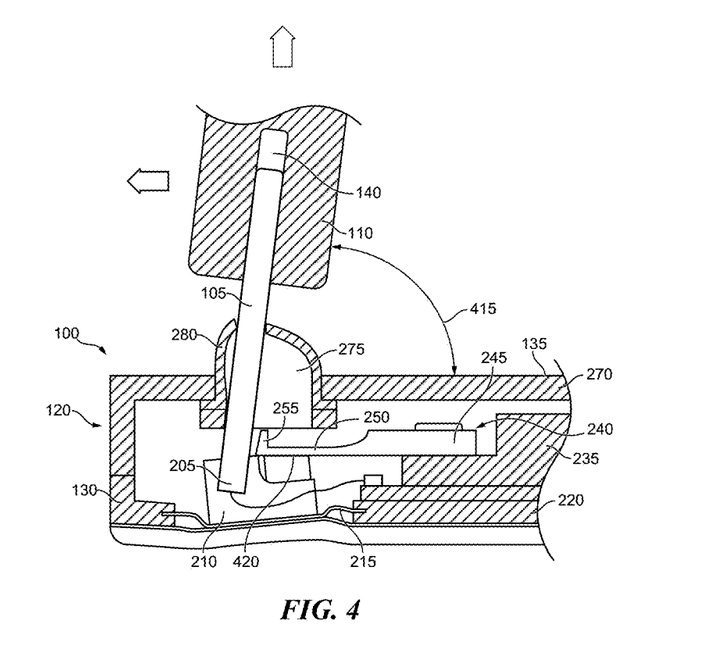
FIG. 4 is a partial cross-sectional view of the docking station shown in FIG. 1 during a demating operation of the electronic device.

Now referring to FIG. 4 a simplified partial cross-sectional view of a demating cycle of electronic device 110 from docking station 100 is illustrated. This figure shows the same cross-sectional view as FIG. 3, however in this view electronic device 110 has been pulled forward and upward such that it is in the process of being demoted from docking station 100. As discussed above, in some embodiments docking station 100 may hold electronic device at an acute angle of approximately 79 degrees to make it easier for the user to interact with the device. However, when attempting to demote electronic device 110 from docking station 100, some users may prefer a larger angle 415. That is, some users may prefer a more perpendicular orientation of electronic device 110 relative to docking station 100 (i.e., that is an angle of greater than 79 degrees and in some embodiments greater than 90 degrees) which may feel more intuitive for some users when demoting the electronic device. To allow electronic device 110 to be temporarily deflected to a more vertical orientation for the demoting cycle, some embodiments of docking station 100 may have a flexible structure coupled to connector plug 105 and housing 120, enabling connector plug 105 to be forcibly deflected in a direction away from the support brace 240. The amount and feel of the force may be adjusted to provide a smooth and intuitive feel for the user, as discussed in more detail below.

As illustrated in FIG. 4, in some embodiments the flexible structure may include bottom wall 220 of housing base 130 and elastomeric insert 280. More specifically, when a user pulls electronic device forward and upward in a demoting cycle, forces which may predominantly be in the form of torque, may be imparted to plug connector 105, bottom wall 220 and elastomeric insert 280. As a result of the applied torque to connector 105, bottom wall 220 and elastomeric insert 280 may temporarily deform as illustrated. In some embodiments, both bottom wall 220 and elastomeric insert 280 may be resilient such that when the user completes the demoting cycle, and the forces on connector 105 are released, the bottom wall and the elastomeric insert force connector plug 105 back against support brace 240. The position of support brace 240 may be adjusted to define angle 415 of connector plug 105.

As discussed above, in some embodiments bottom wall 220 of housing base 130 may include mounting plate 215 insert molded into the bottom wall and both the bottom wall and the mounting plate may deform. In further embodiments deformation may occur only in mounting plate 215 while in other embodiments one or more portions of bottom wall 220 beyond the mounting plate may deform. In yet further embodiments elastomeric mounting pad 315 may also deform. In other embodiments, bracket 210 may be configured have an angled relief portion 420 so that during a demoting cycle the bracket does not interfere with support brace 240.

In further embodiments, the amount of force and the feel of the force (i.e., spongy or stiff) may be tuned by modifying bottom wall 220, mounting plate 215 and elastomeric insert 280. For example, the amount of force required to tilt connector 105 forward may be increased by increasing the thickness of bottom wall 220, mounting plate 215, and/or a wall thickness of elastomeric insert 280. In other embodiments material properties of one or more of the aforementioned structures may be modified to change the amount and/or feel of the force. Further, the feel of the force may be made to feel spongy by using elastomeric insert 280 primarily as the resilient force. Conversely the feel of the force may be made to feel more stiff by using mounting plate 215 and bottom wall 220 primarily as the resilient force.

To provide elastomeric insert 280 with resilient properties, in some embodiments it may be made from a rubber, a silicone, or other elastomeric material. In further embodiments elastomeric insert 280 may be a silicone with hardness between 20 and 120 Shore A, while in other embodiments it may have a hardness between 40 and 100 Shore A. In yet further embodiments it may have a hardness between 60 and 80 Shore A.

Figure 5:
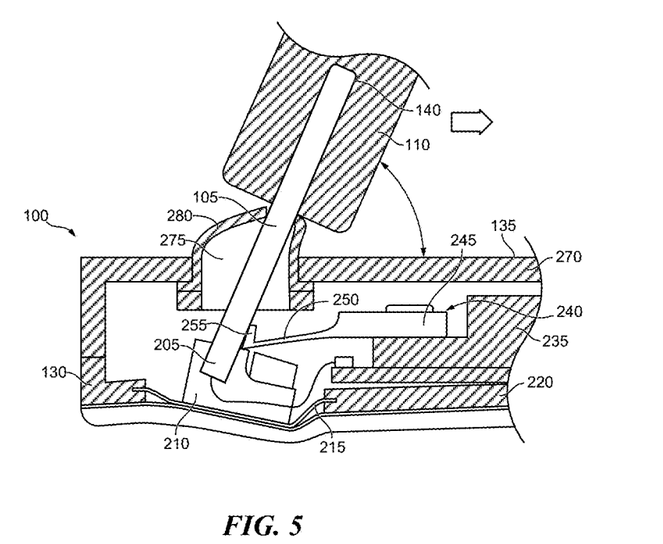
FIG. 5 is a partial cross-sectional view the docking station shown in FIG. 1 with an electronic device that has been deflected rearward.

Now referring to FIG. 5 a simplified partial cross-sectional view of an embodiment employing a protective mechanism that protects electronic device 110 from damage if the device is deflected reward too far is illustrated. This is the same cross-section that was shown in FIGS. 4 and 5, except in this figure electronic device 110 has been significantly deflected rearward and some of the protective features of docking station 100 are employed to protect the electronic device from damage.

As discussed above, in some embodiments, docking station 100 supports electronic device 110 with only connector 105. Since there is no additional support for electronic device 110, in some embodiments connector 105 is designed to deflect at a predetermined force that is less than a force that is required to damage electronic device 110 (e.g., such as device receptacle connector 140 in FIG. 1). More specifically, in some embodiments support brace 240 has deflectable arm 250 that is configured to support a predetermined maximum amount of force applied to connector plug 105 and to deflect as illustrated in FIG. 5) if the predetermined maximum amount of force is exceeded. In some embodiments the predetermined maximum amount of force is less than a minimum force that is required to damage portable electronic device 110 (e.g., receptacle connector 140 in FIG. 1) so that the electronic device is protected from damage.

In some embodiments the predetermined maximum amount of force support brace 240 is configured to provide is between 800 and 1800 Newton millimeters. In further embodiments, the minimum amount of force that is required to damage portable electronic device 110 is between 1000 and 2000 Newton millimeters.

In further embodiments, docking station 100 may be configured to allow connector 105 to deflect in other directions (e.g., forward or sideways) so the electronic device is not damaged due to over deflection. For example, as illustrated in FIG. 4 connector 105 may deflect forward to relieve stress applied to receptacle connector 140 (see FIG. 1). In further embodiments electronic device 110 may be over deflected forward or sideways and features of docking station 100 may be employed to relieve stress applied to receptacle connector 140 such that it is not damaged, as discussed in more detail below.

Figure 6:
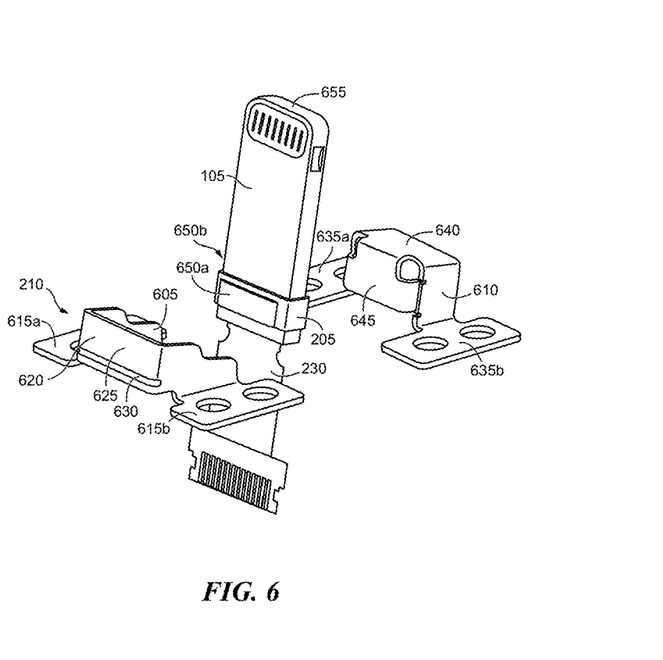
FIG. 6 is a front perspective exploded view of a plug connector and a mounting bracket for the docking station shown in FIG. 1.
Figure 7:
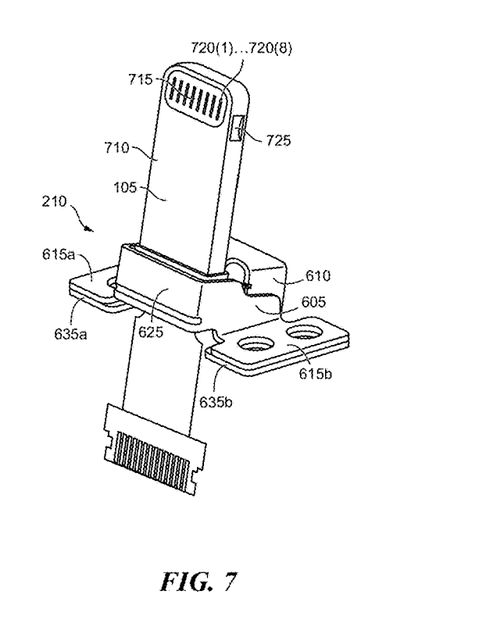
FIG. 7 is a front perspective view of a plug connector and a mounting bracket for the docking station shown in FIG. 1.

Now referring to FIGS. 6 and 7, one embodiment of bracket 210 is illustrated that may be configured to provide further protection to electronic device 110 (see FIG. 1) in case it is deflected forward, rearward or sideways too far. In these figures plug connector 105 and bracket 210 are illustrated in an exploded view in greater detail along with their protective features. Myriad protective features may be employed to allow docking station 100 (see FIG. 1) to fail (e.g., catastrophically deform or break) at a lower force than would be required to damage electronic device 110, thus protecting the electronic device from damage while secured to the docking station.

In some embodiments, bracket 210 may comprise atop bracket 605 and a bottom bracket 610. Top bracket 605 may have a pair of mounting flanges 615a, 615b connected by a u-shaped cup 620. U-shaped cup may have a substantially flat attachment face 625 that may have one or more rigidizing formations 630 on it. Bottom bracket 610, may have a pair of mounting flanges 635a, 635b connected by a support structure 640. Support structure 640 may have a substantially flat attachment face 645. Plug connector 105 may have a pair of attachment bosses 650a, 650b (only 650a is illustrated in FIG. 6) disposed on either side of first end 205 of the plug connector. A flexible circuit board 230 or other electronic interconnect cable may extend from first end 205 of plug connector 105. A second end 655 of plug connector 105 is configured to mate with electronic device 110 (see FIG. 1).

Now referring to FIG. 7, top bracket 605 and a bottom bracket 610 are illustrated in the assembled condition. Top bracket 605 and bottom bracket 610 may be disposed against connector 105 such that mounting flanges 615a, 615b, 635a, 635b are aligned on top of one another.

Further, attachment face 625 of top bracket 605 may be secured to attachment boss 650a (see FIG. 6) with myriad methods including, but not limited to laser welding, spot welding, soldering, brazing, adhesive, stamping, swaging or other techniques. Attachment face 645 of bottom bracket 610 may be attached to attachment boss 650b with similar methods. Bracket 210 may then be secured to mounting plate 215 (see FIG. 2) with fasteners or another method.

In other embodiments, top bracket 605 and bottom bracket 610 may be configured to resist torsion of electronic device 110 (see FIG. 1). That is, because electronic device 110 is only supported by connector 105, bracket 210 may be configured to rigidly support the electronic device such that it resists twisting and/or torsion. In one embodiment bracket 210 is configured to have a substantially square cross-section to resist such torsion and twisting forces.

Myriad protective features may be employed to enable bracket 210 to fail before electronic device 110. In one embodiment the quantity and configuration of laser welds on attachment faces 625, 645 may be designed to break before electronic device 110. More specifically, the number of laser welds may be limited such that attachment faces 625, 645 break away from attachment bosses 650a, 650b before electronic device 110 is damaged. In one embodiment a staggered row of laser welds may be used. In other embodiments laser welds may be located proximate each other so the heat affected zones from each weld create a weakened area of attachment faces 625, 645 so they fail before electronic device 110. In one embodiment a line of laser welds may be used where the welds are proximate each other. In another embodiment, mounting flanges 615a, 615b, 635a, 635b, u-shaped cup 620, or support structure 640 may be designed to bend, distort, break, yield or fail in some other way before electronic device is damaged. In one embodiment fasteners that are used to secure mounting flanges 615a, 615b, 635a, 635b to mounting plate 215 (see FIG. 2) are designed to break or to pull out of the mounting plate before electronic device 110 is damaged. Other techniques may also be used to enable docking station 100 to fail before electronic device 110.

In some embodiments top bracket 605 and bottom bracket 610 may be manufactured from stainless steel while in other embodiments other metals or metal alloys may be used. In some embodiments the material may be selected to enable it to fail before damage to electronic device occurs. In further embodiments bracket 210 may be plated with one or more layers of metal including, but not limited to, nickel, gold, tin, palladium and silver.

In some embodiments plug connector 105 may be an eight contact axisymmetric dual orientation plug connector. One embodiment may employ a connector as described in U.S. Pat. No. 8,708,745 which is incorporated herein in its entirety for all purposes. Connector 105 may have a tab 710 that may include a first mating surface 715 and in some embodiments may include a second mating surface not shown). A plurality of electrical contacts 720(1) . . . 720(8) may be disposed at the mating surfaces. In some embodiments, electrical contacts 720(1) . . . 720(8) may be disposed on only one mating surface, particularly in embodiments employed in docking stations as the electronic device is always mated in the same orientation. Other embodiments may employ different plugs such as a 30-pin connector or USB type connector. In further embodiments connector plug may have one or more detents 725, that facilitate retention of receptacle connector 140 (see FIG. 1) within electronic device 110. In further embodiments the shape of detents 725 may be modified to enable easier undocking, such as making the depth of the detents less and/or making the slope within the detents more shallow.

Although electronic device 110 (see FIG. 1) is described and illustrated as one particular electronic device, embodiments of the invention are suitable for use with a multiplicity of electronic devices that are matable with a docking station. For example, any device that receives or transmits audio, video or data signals may be used with the invention. In some instances, embodiments of the invention are particularly well suited for use with portable electronic media devices because of their potentially small form factor and their use with docking stations. As used herein, an electronic media device includes any device with at least one electronic component that may be used to present human-perceivable media. Such devices may include, for example, portable music players (e.g., MP3 devices and Apple's iPod devices), portable video players e.g., portable DVD players), cellular telephones (e.g., smart telephones such as Apple's iPhone devices), video cameras, digital still cameras, projection systems e.g., holographic projection systems), gaming systems, PDAs, as well as tablet (e.g., Apple's iPad devices), laptop or other mobile computers. Some of these devices may be configured to provide audio, video or other data or sensory output.

For simplicity, various internal components, such as the control circuitry, graphics circuitry, bus, memory, storage device and other components of electronic device 110 (see FIG. 1) and docking station 100 are not shown in the figures.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A docking station for a portable electronic device, the docking station comprising:
   a housing having an exterior surface; and
   a connector plug extending through the exterior surface and configured to provide the only mechanical support for the electronic device when the electronic device is in a docked position and the connector plug is mated with a receptacle connector associated with the electronic device.

2. The docking station of claim 1 wherein the connector plug extends at an acute angle beyond the exterior surface.

3. The docking station of claim 2 wherein the connector plug is configured rotate under an applied force such that the acute angle is decreased.

4. The docking station of claim 2 wherein the connector plug is secured to a mounting panel disposed within the housing and the mounting panel is configured to deflect and allow the connector plug to rotate under an applied force such that the acute angle is decreased.

5. The docking station of claim 4 wherein the mounting panel includes an insert molded plate that is coupled to the connector.

6. The docking station of claim 2 wherein the acute angle is between 69 and 89 degrees before the electronic device is mated with the connector plug.

7. The docking station of claim 1 wherein a top exterior surface of the housing is flat except for the connector plug that extends through the top exterior surface and an elastomeric insert that surrounds a periphery of the connector plug where the connector plug extends through the top exterior surface.

8. A docking station for a portable electronic device, the docking station comprising:
   a housing having a cover disposed above and secured to a base; and
   a connector plug extending through an exterior surface of the cover and configured to provide exclusive support for the electronic device.

9. The docking station of claim 8 wherein the connector plug extends at an acute angle beyond the exterior surface of the cover.

10. The docking station of claim 9 wherein the connector plug is configured rotate under an applied force such that the acute angle is decreased.

11. The docking station of claim 9 wherein the connector plug is secured to an insert molded panel that forms a portion of the base and the panel is configured to deflect and allow the connector plug to rotate under an applied force such that the acute angle is decreased.

12. The docking station of claim 9 wherein the acute angle is between 69 and 89 degrees.

13. The docking station of claim 8 wherein a top exterior surface of the housing is flat except for the connector plug and an elastomeric insert that surrounds the connector plug where the connector plug extends through the top exterior surface.

14. A docking station for a portable electronic device, the docking station comprising:
   a housing having geometric extents defined by a width a length and a height wherein a top surface of the housing is a plane extending across the width and the length of the housing; and
   no more than one protrusion extending from the top surface wherein the protrusion includes a connector plug oriented at an acute angle relative to the top surface.

15. The docking station of claim 14 wherein the connector plug provides exclusive support for the portable electronic device when the portable electronic device is docked with the docking station.

16. The docking station of claim 14 wherein the no more than one protrusion further includes an elastomeric insert that surrounds a periphery of the connector plug and fits within an aperture of the top surface of the housing.

17. The docking station of claim 16 wherein the elastomeric insert deflects when the acute angle of the connector plug is changed, allowing the connector plug to move relative to the top surface of the housing.

18. The docking station of claim 14 wherein the connector plug is secured to a bottom wall of the housing and wherein the bottom wall is configured to flex, allowing the acute angle of the connector plug to be changed when a force is applied to the connector plug.

19. The docking station of claim 18 wherein the bottom wall includes an insert molded mounting plate that is coupled to the connector.

20. The docking station of claim 14 wherein the acute angle is between 69 and 89 degrees.

* * * * *